US012745485B2

(12) United States Patent
Chen et al.

(10) Patent No.: US 12,745,485 B2
(45) Date of Patent: Sep. 22, 2026

(54) SOLAR CELL, SLICED CELL AND MANUFACTURING METHOD THEREOF, PHOTOVOLTAIC MODULE, AND PHOTOVOLTAIC SYSTEM

(71) Applicant: TRINA SOLAR CO., LTD., Changzhou (CN)

(72) Inventors: Hong Chen, Changzhou (CN); Yifeng Chen, Changzhou (CN); Di Liu, Changzhou (CN); Wenxing Du, Changzhou (CN)

(73) Assignee: TRINA SOLAR CO., LTD., Changzhou (CN)

( * ) Notice: Subject to any disclaimer, the term of this patent is extended or adjusted under 35 U.S.C. 154(b) by 0 days.

(21) Appl. No.: 18/782,343

(22) Filed: Jul. 24, 2024

(65) Prior Publication Data

US 2025/0107271 A1 Mar. 27, 2025

(30) Foreign Application Priority Data

Sep. 25, 2023 (CN) ......................... 202311250282.6

(51) Int. Cl.
*H10F 77/30* (2025.01)
*H10F 71/00* (2025.01)
*H10F 77/20* (2025.01)

(52) U.S. Cl.
CPC ........... *H10F 77/315* (2025.01); *H10F 71/00* (2025.01); *H10F 77/211* (2025.01); *H10F 77/219* (2025.01); *H10F 77/311* (2025.01)

(58) Field of Classification Search
CPC .... H10F 71/121; H10F 71/129; H10F 71/133; H10F 77/20; H10F 77/211; H10F 77/219; H10F 77/311; H10F 77/315
See application file for complete search history.

(56) References Cited

U.S. PATENT DOCUMENTS 9,871,146 B2 1/2018 Shim
11,195,961 B2 12/2021 Murao
(Continued)

FOREIGN PATENT DOCUMENTS

CN 116314382 A 6/2023
EP 3026713 A1 * 6/2016 ............. H10F 1/133
(Continued)

OTHER PUBLICATIONS

WO 2021/031500 A1 English Translation provided by FIT database.*
(Continued)

*Primary Examiner* — Golam Mowla
(74) *Attorney, Agent, or Firm* — Taft, Stettinius & Hollister LLP

(57) ABSTRACT

The present disclosure relates to a solar cell, a sliced cell and a manufacturing method thereof, a photovoltaic module, and a photovoltaic system. The solar cell includes a substrate, a doped conductive layer, a first passivation film layer, and a first dielectric layer; the doped conductive layer being arranged on a first surface of the substrate; the first passivation film layer and the first dielectric layer being sequentially stacked on a side of the doped conductive layer facing away from the substrate; and the doped conductive layer, the first passivation film layer, and the first dielectric layer all covering the first surface of the substrate; wherein the substrate further includes a plurality of first side surfaces adjacent to the first surface, and the first passivation film layer further covers at least part of surfaces of the plurality of first side surfaces. The solar cell, the photovoltaic module, and the photovoltaic system in the present disclosure can reduce recombination losses at side edges of the solar cell and improve efficiency.

16 Claims, 7 Drawing Sheets

(56) References Cited

U.S. PATENT DOCUMENTS

| | | | |
|---|---|---|---|
| 2001/0054436 | A1 | 12/2001 | Mukai |
| 2009/0242032 | A1 | 10/2009 | Yamazaki |
| 2009/0260681 | A1 | 10/2009 | Yun |
| 2011/0100459 | A1 | 5/2011 | Yoon |
| 2011/0139230 | A1 | 6/2011 | Rohatgi et al. |
| 2011/0197964 | A1 | 8/2011 | Jang et al. |
| 2016/0308079 | A1 | 10/2016 | Adachi |
| 2020/0220039 | A1 | 7/2020 | Chang |

FOREIGN PATENT DOCUMENTS

| | | | |
|---|---|---|---|
| EP | 3509112 | A1 | 7/2019 |
| TW | I750610 | B | 12/2021 |
| WO | 2021031500 | A1 | 2/2021 |

OTHER PUBLICATIONS

WO 2021/031500 A1 English Translation provided by FIT database, translated on Feb. 21, 2026.*

Australian Patent Office, Examination Report No. 4 issued in corresponding Application No. 2024216424, 1 dated May 8, 2025, 4 pp.

Australian Patent Office, Examination Report No. 1 issued in corresponding Application No. 2024216424, dared Sep. 19, 2024, 6 pp.

Australian Patent Office, Examination Report No. 3 issued in corresponding Application No. 2024216424, 1 dated Feb. 18, 2025, 6 pp.

* cited by examiner

SOLAR CELL, SLICED CELL AND MANUFACTURING METHOD THEREOF, PHOTOVOLTAIC MODULE, AND PHOTOVOLTAIC SYSTEM

CROSS-REFERENCE TO RELATED APPLICATIONS

This application claims priority to Chinese Patent Application No. 2023112502826, entitled "SOLAR CELL, SLICED CELL AND MANUFACTURING METHOD THEREOF, PHOTOVOLTAIC MODULE, AND PHOTOVOLTAIC SYSTEM" and filed with the China Patent Office on Sep. 25, 2023, the entire contents of which are incorporated herein by reference.

TECHNICAL FIELD

The present disclosure relates to the field of solar cell technologies, and in particular to a solar cell, a sliced cell and a manufacturing method thereof, a photovoltaic module, and a photovoltaic system.

BACKGROUND

With continuous development of a photovoltaic power generation technology, people's requirements for photoelectric conversion efficiency of solar cells are also constantly increasing. However, recombination losses are still an important loss mechanism affecting the photoelectric conversion efficiency of the solar cells. The recombination losses are particularly evident at side edges of the solar cells, making the solar cells less efficient.

SUMMARY

Based on this, there is a need to provide a solar cell, a sliced cell and a manufacturing method thereof, a photovoltaic module, and a photovoltaic system which can reduce recombination losses at side edges of the solar cell and have higher efficiency.

In a first aspect of embodiments of the present disclosure, a solar cell is provided, wherein the solar cell includes a substrate, a doped conductive layer, a first passivation film layer, and a first dielectric layer;

- the doped conductive layer being arranged on a first surface of the substrate;
- the first passivation film layer and the first dielectric layer being sequentially stacked on a side of the doped conductive layer facing away from the substrate; and
- the doped conductive layer, the first passivation film layer, and the first dielectric layer all covering the first surface of the substrate;
- wherein the substrate further includes a plurality of first side surfaces adjacent to the first surface, and the first passivation film layer further covers at least part of surfaces of the plurality of first side surfaces.

In an embodiment, the first passivation film layer completely covers each of the first side surfaces.

In an embodiment, the solar cell further includes a passivated contact layer arranged on one side of a second surface of the substrate, and a second passivation film layer stacked on a surface of a side of the passivated contact layer facing away from the substrate; wherein the second surface of the substrate is adjacent to the first side surface and is opposite to the first surface;

- the passivated contact layer and the second passivation film layer both cover the second surface of the substrate; and
- the first passivation film layer further covers at least an edge of the passivated contact layer on a same side as the first side surface.

In an embodiment, an edge of the first passivation film layer along a thickness direction of the substrate is flush with an outer surface of the second passivation film layer along the thickness direction of the substrate.

In an embodiment, the first passivation film layer further covers an edge region of the passivated contact layer, and the part of the first passivation film layer covering the edge region is located between the second passivation film layer and the passivated contact layer.

In an embodiment, a coverage area of the first passivation film layer in the edge region of the passivated contact layer ranges from 1 $mm^2$ to 38220 $mm^2$.

In an embodiment, the first passivation film layer covers a surface of the passivated contact layer facing away from the substrate, and the part of the first passivation film layer covering the passivated contact layer is located between the second passivation film layer and the passivated contact layer; and

- the solar cell further includes a second electrode, the second electrode being arranged on the second passivation film layer, passing through the second passivation film layer and the first passivation film layer from one side of the second surface, and being in ohmic contact with the passivated contact layer.

In an embodiment, the second passivation film layer is made of a material including at least one of $SiN_x$, $SiON_x$, and $SiO_x$.

In an embodiment, the solar cell further includes a third dielectric layer, the third dielectric layer being located between the doped conductive layer and the first passivation film layer.

In an embodiment, the third dielectric layer is a thermal oxidation layer.

In an embodiment, the first passivation film layer is made of a material including $AlO_x$; and/or

- the first dielectric layer is an antireflection layer, and the first dielectric layer is made of a material including at least one of $SiN_x$, $SiON_x$, and $SiO_x$.

In a second aspect of the embodiments of the present application, a sliced cell is provided, including:

- a first body, the first body being cut from the solar cell described above, the substrate in the first body further including at least one first cut side surface adjacent to the first surface; and
- a fourth passivation film layer arranged on the first cut side surface in a one-to-one correspondence manner, and the fourth passivation film layer completely covering the corresponding first cut side surface.

In an embodiment, the fourth passivation film layer further covers at least part of a surface of the first body on one side of the first surface; and/or

- the substrate further includes a second surface opposite to the first surface, and the fourth passivation film layer further covers at least part of a surface of the first body on one side of the second surface.

In an embodiment, when the fourth passivation film layer further covers at least part of the surface of the first body on one side of the first surface,

- the fourth passivation film layer covers an edge region of the first dielectric layer; or the first dielectric layer is provided with a first electrode, the first electrode including a first busbar, and the fourth passivation film layer covers a first region of the first dielectric layer, the first region being a region on a surface of the first dielectric layer facing away from the substrate where the first busbar is not provided.

In an embodiment, the solar cell further includes a passivated contact layer arranged on the side of a second surface of the substrate, and a second passivation film layer stacked on a surface of a side of the passivated contact layer facing away from the substrate; wherein the second surface of the substrate is adjacent to the first side surface and is opposite to the first surface;

the passivated contact layer and the second passivation film layer both cover the second surface of the substrate; and when the fourth passivation film layer further covers at least part of the surface of the first body on one side of the second surface, the fourth passivation film layer covers an edge region of the second passivation film layer; or the second passivation film layer is provided with a second electrode, the second electrode including a second busbar, and the fourth passivation film layer covers a second region of the second passivation film layer, the second region being a region on a surface of the second passivation film layer facing away from the substrate where the second busbar is not provided.

In a third aspect of the embodiments of the present application, a solar cell is provided, wherein the solar cell includes a substrate, a doped conductive layer, a third passivation film layer, and a second dielectric layer; the third passivation film layer being made of a material including at least one of $AlO_x$ and $SiN_x$; and the second dielectric layer being made of a material including at least one of $SiN_x$ and $SiO_x$;

the doped conductive layer and the second dielectric layer being sequentially stacked on a first surface of the substrate; and the doped conductive layer and the second dielectric layer both covering the first surface of the substrate;

the third passivation film layer being stacked on a second surface of the substrate; and the third passivation film layer covering the second surface of the substrate; and the first surface and the second surface of the substrate being arranged opposite to each other, and the substrate further including a plurality of first side surfaces adjacent between the first surface and the second surface;

wherein the third passivation film layer further covers at least part of surfaces of the plurality of first side surfaces.

In an embodiment, the third passivation film layer completely covers each of the first side surfaces.

In an embodiment, the third passivation film layer further covers at least an edge of the doped conductive layer on a same side as the first side surface.

In an embodiment, the third passivation film layer further covers an edge region of the doped conductive layer, and the part of the third passivation film layer covering the edge region is located between the second dielectric layer and the doped conductive layer.

In an embodiment, a coverage area of the third passivation film layer in the edge region of the doped conductive layer ranges from 1 $mm^2$ to 38220 $mm^2$.

In an embodiment, the second surface of the substrate is provided with a local metal back surface field; and the solar cell further includes a third electrode and a fourth electrode, the third electrode passing through the second dielectric layer and being in ohmic contact with the doped conductive layer, and the fourth electrode passing through the third passivation film layer and being in ohmic contact with the local metal back surface field.

In a fourth aspect of the embodiments of the present application, a sliced cell is provided, including:

a second body, the second body being cut from the solar cell described above, the substrate in the second body further including at least one second cut side surface adjacent between the first surface and the second surface; and a fifth passivation film layer arranged on the second cut side surface in a one-to-one correspondence manner, and the fifth passivation film layer completely covering the corresponding second cut side surface.

In an embodiment, the fifth passivation film layer further covers at least part of a surface of the second body on one side of the first surface; and/or the fifth passivation film layer further covers at least part of a surface of the second body on one side of the second surface.

In an embodiment, when the fifth passivation film layer further covers at least part of the surface of the second body on one side of the first surface, the fifth passivation film layer covers an edge region of the second dielectric layer; or the second dielectric layer is provided with a third electrode, the third electrode including a third busbar, and the fifth passivation film layer covers a third region of the second dielectric layer, the third region being a region on a surface of the second dielectric layer facing away from the substrate where the third busbar is not provided.

In an embodiment, when the fifth passivation film layer further covers at least part of the surface of the second body on one side of the second surface, the fifth passivation film layer covers an edge region of the third passivation film layer; or the third passivation film layer is provided with a fourth electrode, the fourth electrode including a fourth busbar, and the fifth passivation film layer covers a fourth region of the third passivation film layer, the fourth region being a region on a surface of the third passivation film layer facing away from the substrate where the fourth busbar is not provided.

In a fifth aspect of the embodiments of the present application, a manufacturing method for a sliced cell is provided, including:

providing the solar cell described above;

cutting the solar cell into sliced cell bases, the sliced cell bases being provided with cut side surfaces; and forming passivation film layers on the cut side surfaces.

In an embodiment, the cut side surfaces included in the sliced cell bases are same in number and position; and the step of forming passivation film layers on the cut side surfaces specifically includes:

stacking the sliced cell bases along a thickness direction in a state where the cut side surfaces corresponding to the sliced cell bases are aligned; and forming the passivation film layers on the cut side surfaces.

In an embodiment, subsequent to the step of stacking the sliced cell bases along a thickness direction in a state where the cut side surfaces corresponding to the sliced cell bases are aligned, the method further includes:

arranging baffles on outer side surfaces of two outermost sliced cell bases in a stacking direction in the stacked sliced cell bases.

In a sixth aspect of the embodiments of the present application, a photovoltaic module is provided, including at least one solar cell string, the solar cell string including at least two solar cells described above; or the solar cell string including at least two sliced cells described above.

In a seventh aspect of the embodiments of the present application, a photovoltaic system is provided, including the photovoltaic module described above.

The solar cell, the sliced cell and the manufacturing method thereof, the photovoltaic module, and the photovoltaic system described above have the following beneficial effects.

The first passivation film layer further covers at least part of surfaces of the plurality of first side surfaces, the plurality of first side surfaces correspond to side surfaces of the solar cell, and the first passivation film layer protects at least part of the surfaces of the plurality of first side surfaces, which can reduce recombinations on the first side surfaces, that is, reduce recombination losses at side edges of the solar cell, and improve efficiency of the solar cell.

BRIEF DESCRIPTION OF THE DRAWINGS

FIG. 12 is a schematic structural diagram of a sliced cell according to Embodiment 4 of the present disclosure;

FIG. 13 is another schematic structural diagram of the sliced cell according to Embodiment 4 of the present disclosure;

REFERENCE SIGNS

Figures 1, 2:
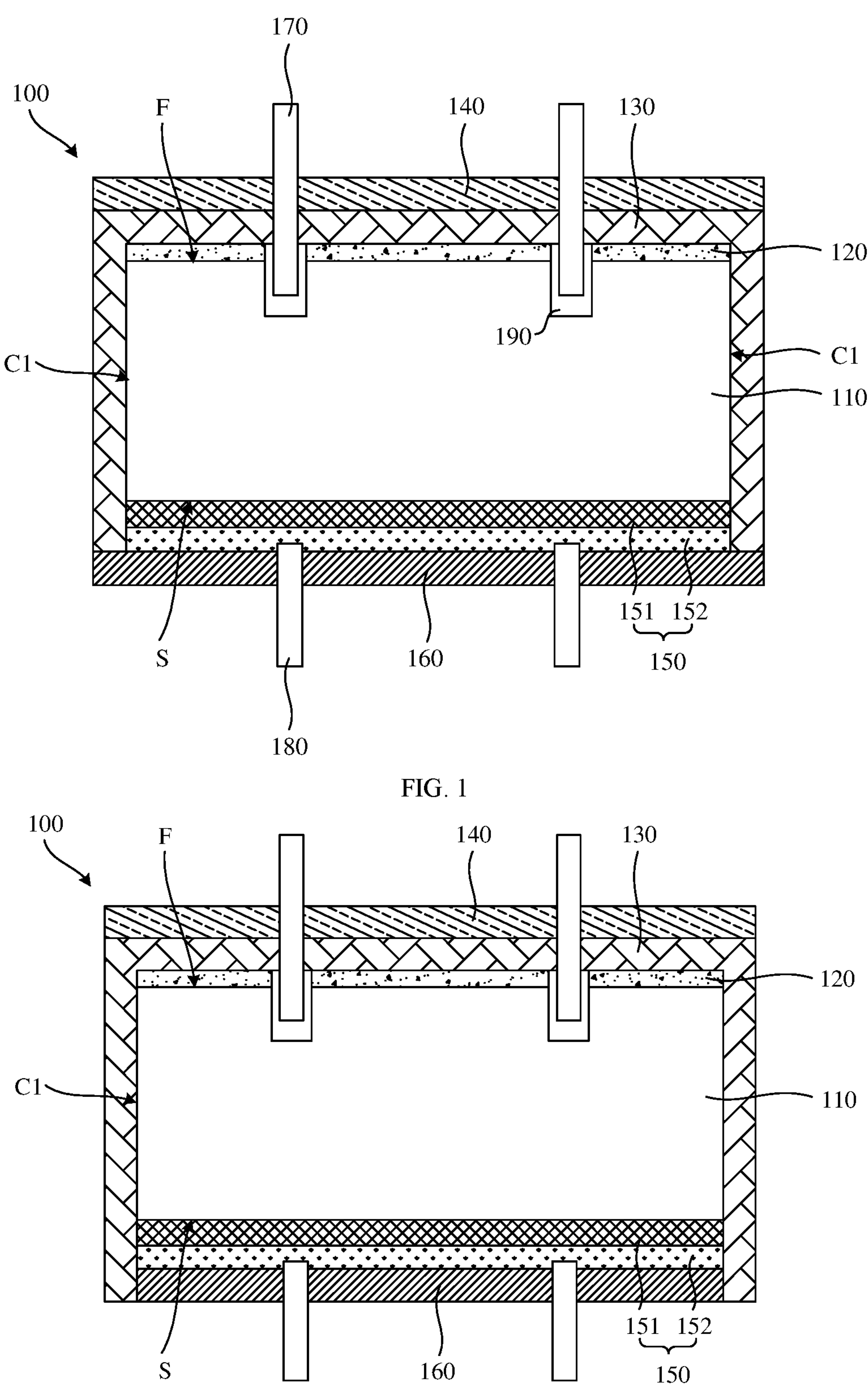
FIG. 1 is a schematic structural diagram of a solar cell according to Embodiment 1 of the present disclosure.
FIG. 2 is another schematic structural diagram of the solar cell according to Embodiment 1 of the present disclosure.

100, 200: solar cell; 110: substrate; 120, 220: doped conductive layer; 130: first passivation film layer; 140: first dielectric layer; 150: passivated contact layer; 151: tunnel oxide layer; 152: polysilicon doped conductive layer; 160: second passivation film layer; 170: first electrode; 180: second electrode; 190: heavily doped region; 310: fourth passivation film layer; 320: fifth passivation film layer; 330: baffle; 340: sliced cell base; 350: busbar;

230: third passivation film layer; 240: second dielectric layer; 250: third electrode; 260: fourth electrode; 270: local metal back surface field;

F: first surface; S: second surface; C1: first side surface; C2: cut side surface; C11: first cut side surface; C12: second cut side surface; Z1, Z2: edge region;

1000: first body; 2000: second body.

DETAILED DESCRIPTION

In order to make the above objectives, features and advantages of the present disclosure more obvious and understandable, specific implementations of the present disclosure are described in detail below with reference to the accompanying drawings. In the following description, many specific details are set forth in order to fully understand the present disclosure. However, the present disclosure can be implemented in many other ways different from those described herein, and those skilled in the art can make similar improvements without departing from the connotation of the present disclosure. Therefore, the present disclosure is not limited by specific embodiments disclosed below.

In the description of the present disclosure, it is to be understood that the orientation or position relationships indicated by the terms "central", "longitudinal", "transverse", "length", "width", "thickness", "upper", "lower", "front", "back", "left", "right", "vertical", "horizontal", "top", "bottom", "inner", "outer", "clockwise", "counter-clockwise", "axial", "radial", "circumferential", and the like are based on the orientation or position relationships shown in the accompanying drawings and are intended to facilitate the description of the present disclosure and simplify the description only, rather than indicating or implying that the apparatus or element referred to must have a particular orientation or be constructed and operated in a particular orientation, and therefore are not to be interpreted as limiting the present disclosure.

In addition, the terms "first" and "second" are used for descriptive purposes only, which cannot be construed as indicating or implying a relative importance, or implicitly specifying the number of the indicated technical features. Therefore, the features defined with "first" and "second" may explicitly or implicitly include at least one feature. In the description of the present disclosure, "a plurality of" means at least two, such as two or three, unless otherwise defined explicitly and specifically.

In the present disclosure, unless otherwise specified and defined explicitly, the terms "mount", "connect", "join", and "fix" should be understood in a broad sense, which may be, for example, a fixed connection, a detachable connection, or an integral connection; a mechanical connection or an electrical connection; or a direct connection, an indirect connection via an intermediate medium, an internal connection between two elements, or interaction between two elements. Those of ordinary skill in the art can understand specific meanings of these terms in the present disclosure according to specific situations.

In the present disclosure, unless otherwise explicitly specified and defined, the expression a first feature being "on" or "under" a second feature may be the case that the first feature is in direct contact with the second feature, or the first feature is in indirect contact with the second feature via an intermediate medium. Furthermore, the expression the first feature being "over", "above" and "on top of" the second feature may be the case that the first feature is directly above or obliquely above the second feature, or only means that the level of the first feature is higher than that of the second feature. The expression the first feature being "below", "underneath" or "under" the second feature may be the case that the first feature is directly underneath or obliquely underneath the second feature, or only means that the level of the first feature is lower than that of the second feature.

It is to be noted that when one element is referred to as being "fixed to" or "arranged on" another element, it may be directly disposed on the other element or an intermediate element may exist. When one element is considered to be "connected to" another element, it may be directly connected to the another element or an intermediate element may co-exist. The terms "vertical", "horizontal", "left", "right" and similar expressions used herein are for illustrative purposes only and do not represent an only implementation.

A solar cell, a sliced cell and a manufacturing method thereof, a photovoltaic module, and a photovoltaic system according to embodiments of the present disclosure are described below with reference to the accompanying drawings.

Embodiment 1

Figures 3, 4:
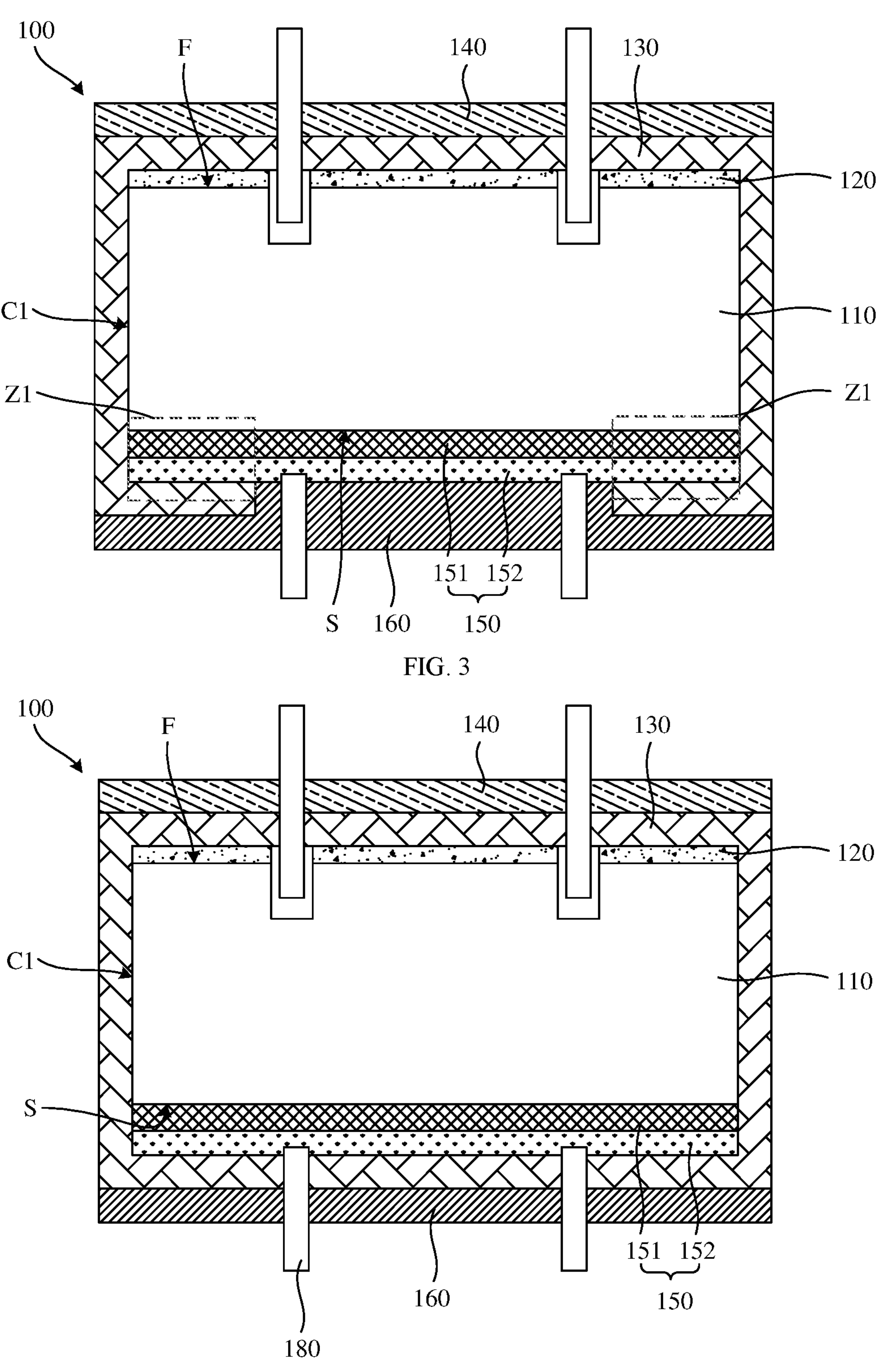
FIG. 3 is yet another schematic structural diagram of the solar cell according to Embodiment 1 of the present disclosure.
FIG. 4 is still another schematic structural diagram of the solar cell according to Embodiment 1 of the present disclosure.
Figures 5, 6:
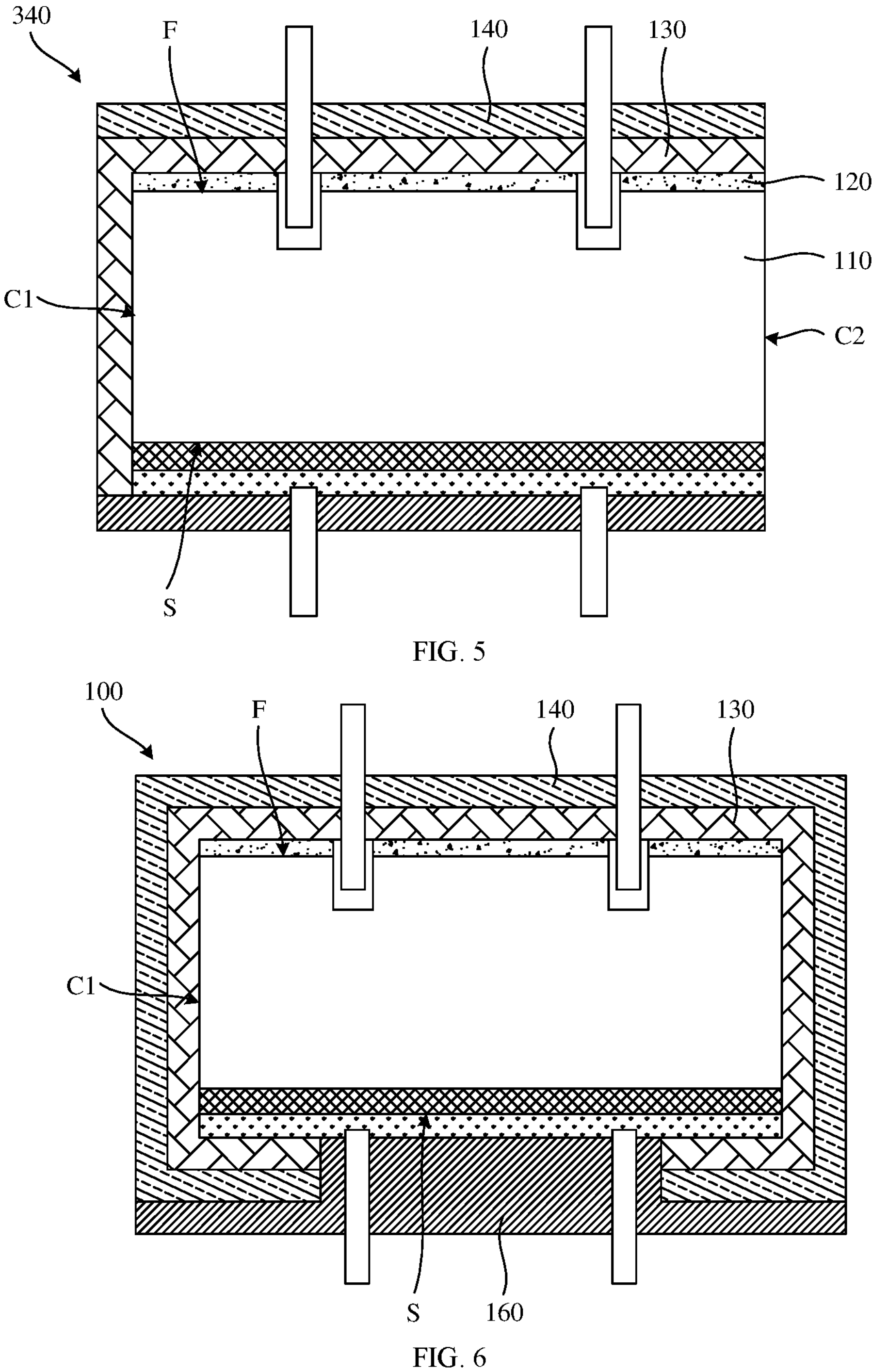
FIG. 5 is a schematic structural diagram of a sliced cell base according to Embodiment 1 of the present disclosure.
FIG. 6 is still another schematic structural diagram of the solar cell according to Embodiment 1 of the present disclosure.

FIG. 1 is a schematic structural diagram of a solar cell according to Embodiment 1 of the present disclosure, FIG. 2 is another schematic structural diagram of the solar cell according to Embodiment 1 of the present disclosure, FIG. 3 is yet another schematic structural diagram of the solar cell according to Embodiment 1 of the present disclosure, FIG. 4 is still another schematic structural diagram of the solar cell according to Embodiment 1 of the present disclosure, FIG. 5 is a schematic structural diagram of a sliced cell base according to Embodiment 1 of the present disclosure, and FIG. 6 is still another schematic structural diagram of the solar cell according to Embodiment 1 of the present disclosure.

Referring to FIG. 1, a solar cell 100 provided in this embodiment includes a substrate 110, a doped conductive layer 120, a first passivation film layer 130, and a first dielectric layer 140.

The doped conductive layer 120 is arranged on a first surface F of the substrate 110. The first passivation film layer 130 and the first dielectric layer 140 are sequentially stacked on a side of the doped conductive layer 120 facing away from the substrate 110. The doped conductive layer 120, the first passivation film layer 130, and the first dielectric layer 140 all cover the first surface F of the substrate 110.

The substrate 110 further includes a plurality of first side surfaces C1 adjacent to the first surface F, and the first passivation film layer 130 further covers at least part of surfaces of the plurality of first side surfaces C1.

The first passivation film layer 130 further covers at least part of surfaces of the plurality of first side surfaces C1, the plurality of first side surfaces C1 correspond to side surfaces of the solar cell 100, and the first passivation film layer 130 protects at least part of the surfaces of the plurality of first side surfaces C1, which can reduce recombinations on the first side surfaces C1, that is, reduce recombination losses at side edges of the solar cell 100, and improve efficiency of the solar cell 100.

The first dielectric layer 140 may be an antireflection layer, and may also play a passivation role. The first dielectric layer 140 is made of a material including at least one of $SiN_x$, $SiON_x$, and $SiO_x$, which may be, for example, a laminate of a $SiN_x$ layer, a $SiON_x$ layer, and a $SiO_x$ layer. In this way, a passivation effect can be improved, and antireflection performance of the first dielectric layer 140 can be improved.

The first dielectric layer 140, the first passivation film layer 130, and a second passivation film layer 160 described later may all adopt a single-layer or multi-layer structure. The first passivation film layer 130 is made of a material including $AlO_x$, which may be, for example, $Al_2O_3$. The $Al_2O_3$ film layer is featured with a strong H passivation capability, excellent field passivation performance, good film formation quality, and fast film formation time, making it the best choice to improve efficiency of the solar cell. The doped conductive layer 120 is configured to form a PN junction with the substrate 110, and a formation range thereof may be limited to, for example, only the first surface F of the substrate 110.

In addition, in the embodiments of the present disclosure, two opposite surfaces of the substrate 110 are respectively defined as a first surface F and a second surface S. One of the first surface F and the second surface S may be a front surface (e.g., a light-receiving surface), and the other may be a back surface (e.g., a backlight surface). Side surfaces adjacent between the first surface F and the second surface S includes the first side surfaces C1. For example, the side surfaces adjacent between the first side surfaces C1 and the second surface S are at least partially the first side surfaces C1 or are wholly the first side surfaces C1.

In some embodiments, the solar cell 100 may be cut into sliced cell bases 340. Referring to FIG. 5, the side surfaces adjacent between the first surface F and the second surface S may also include at least one cut side surface C2. The cut side surface C2 is a side surface formed by cutting. Generally, the cut side surface C2 is exposed, or after the solar cell 100 is manufactured, a passivation film layer (a passivation film layer different from functional film layers such as the first passivation film layer 130 and the first dielectric layer 140 in the solar cell 100) is further provided separately to cover the cut side surface C2 to prevent recombination losses on the cut side surface C2. Refer to Embodiment 3 and Embodiment 4 described later for details. Certainly, the passivation film layer on the cut side surface C2 and the passivation film layer on the first side surface C1 are film layers formed in different processes. In this case, the side surfaces adjacent between the first surface F and the second surface S may be formed by the first side surfaces C1 and the cut side surfaces C2. The first side surfaces C1 and the cut side surfaces C2 are arranged around a circumferential direction of the substrate 110. The first side surfaces C1 and the cut side surfaces C2 may be arranged alternately, or the first side surfaces C1 are sequentially arranged and the cut side surfaces C2 are sequentially arranged. A specific arrangement manner is determined according to a cutting manner of the solar cell 100. It may be understood that the first side surface C1 is an original side surface of the substrate 110, and the cut side surface C2 is a side surface newly formed on the substrate 110 after the solar cell is cut.

In addition, "the first passivation film layer 130 and the first dielectric layer 140 are sequentially stacked on a side of the doped conductive layer 120 facing away from the substrate 110" means that at least part of the first passivation film layer 130 and the first dielectric layer 140 are located on one side of the first surface F of the substrate 110. Certainly, this includes a situation where a film layer may be provided between the first passivation film layer 130 and the doped conductive layer 120. For example, the solar cell 100 further includes a third dielectric layer (not shown), and the third dielectric layer is located between the doped conductive layer 120 and the first passivation film layer 130. The third dielectric layer may be, for example, a film layer that can prevent a PID effect such as a thermal oxidation layer. For example, the third dielectric layer may include $SiO_x$, for example, $SiO_2$.

Alternatively, as shown in FIG. 1, the first passivation film layer 130 may be directly stacked on a surface of the doped conductive layer 120 facing away from the substrate 110. There is no other film layer between the first passivation film layer 130 and the doped conductive layer 120.

The doped conductive layer 120, the first passivation film layer 130, and the first dielectric layer 140 all cover the first surface F of the substrate 110. It is to be noted that, in the embodiments of the present disclosure, "cover" refers to projection covering, which means that a covered object is within a range of a projection of a covering subject. For example, "the first passivation film layer 130 covers the first surface F of the substrate 110" means that a projection range of the first passivation film layer 130 on the substrate 110 is larger than the first surface F and the first surface F is located within the projection range of the first passivation film layer 130 on the substrate 110. For example, "the first dielectric layer 140 covers the first surface F of the substrate 110" means that a projection range of the first dielectric layer 140 on the substrate 110 is larger than the first surface F and the first surface F is located within the projection range of the first dielectric layer 140.

The first passivation film layer 130 further covers at least part of surfaces of the plurality of first side surfaces. For example, the first passivation film layer 130 may cover all of the first side surfaces C1, or the first passivation film layer 130 may cover only part of the first side surfaces C1.

In a case where the first side surface C1 is covered with the first passivation film layer 130, the first passivation film layer 130 may cover at least part of the first side surface C1. Certainly, in this case, the first passivation film layer 130 continuously covers the first surface F to the first side surface C1.

In the embodiments of the present disclosure, still referring to FIG. 1, the solar cell 100 further includes a passivated contact layer 150 arranged on one side of the second surface S of the substrate 110, and a second passivation film layer 160 stacked on a surface of a side of the passivated contact layer 150 facing away from the substrate 110, and the passivated contact layer 150 and the second passivation film layer 160 both cover the second surface S of the substrate 110. Herein, the passivated contact layer 150 may include a tunnel oxide layer 151 and a polysilicon doped conductive layer 152 that are sequentially stacked on the second surface S of the substrate 110.

The second passivation film layer is made of a material including at least one of $SiN_x$, $SiON_x$, and $SiO_x$, which may be, for example, a laminate structure in which a $SiN_x$ layer, a $SiON_x$ layer, and a $SiO_x$ layer are stacked on each other. In this way, the passivation effect is better.

In the embodiments of the present disclosure, the solar cell 100 further includes a first electrode 170 and a second electrode 180, and the first electrode 170 is arranged on one side of the first surface F of the substrate 110, passes through the first dielectric layer 140 and the first passivation film layer 130, and is in ohmic contact with the doped conductive layer 120. Certainly, a heavily doped region 190 locally heavily doped may further be provided in the doped conductive layer 120. Through ohmic contact of the first electrode 170 with the heavily doped region 190, contact resistance can be reduced.

The second electrode 180 is arranged on the second passivation film layer 160 on the second surface S of the substrate 110, passes through the second passivation film layer 160, and is in ohmic contact with a polysilicon doped conductive layer 152 of the passivated contact layer 150.

Further, the first passivation film layer 130 completely covers each of the first side surfaces C1, so as to better protect the first side surfaces C1 with more evident recombination losses.

As a possible implementation, the first passivation film layer 130 may cover only the first surface F to the first side surface C1 and then stop.

Alternatively, after completely covering the first side surface C1, the first passivation film layer 130 continues to extend towards the second surface S of the substrate 110.

During specific implementation, the first passivation film layer 130 further covers at least an edge of the passivated contact layer 150 on a same side as the first side surface C1.

For example, referring to FIG. 1, an edge of the first passivation film layer 130 along a thickness direction of the substrate 110 is flush with an outer surface of the passivated contact layer 150 along the thickness direction of the substrate 110. Further, the second passivation film layer 160 may be stacked on the edge of the first passivation film layer 130 along the thickness direction of the substrate 110.

Alternatively, referring to FIG. 2, the edge of the first passivation film layer 130 along the thickness direction of the substrate 110 is flush with an outer surface of the second passivation film layer 160 along the thickness direction of the substrate 110.

Alternatively, referring to FIG. 3, the first passivation film layer 130 further covers an edge region Z1 of the passivated contact layer 150, and the part of the first passivation film layer 130 covering the edge region Z1 is located between the second passivation film layer 160 and the passivated contact layer 150.

It may be understood that the first passivation film layer 130 covers the edge region Z1 of the passivated contact layer 150 and the second passivation film layer 160 is also partially stacked on the part of the first passivation film layer 130 covering the edge region Z1, from which it may be seen that the first passivation film layer 130 is continuously formed from the first side surface C1 to the second surface S of the substrate 110. Compared with a situation where the first passivation film layer 130 is formed only on a side surface of the solar cell 100, film formation at a junction of the first side surface C1 and the second surface S is more reliable and the film formation is more uniform, which can better protect the junction of the first side surface C1 and the second surface S together with the coverage of the second passivation film layer 160. In other words, it can be ensured that the entire first side surface C1 of the substrate 110 and the side surface of the passivated contact layer 150 are wrapped and protected. Certainly, in this case, a passivation field can also be formed in the edge region of the second surface S, and recombination centers of the second surface S of the substrate 110 can also be effectively reduced. Therefore, a junction between a side edge of the solar cell 100 and the second surface S can have a better reduced recombination effect, and the passivation effect on the second surface S can be enhanced.

Further, a coverage area of the first passivation film layer 130 in the edge region Z1 of the passivated contact layer 150 ranges from 1 $mm^2$ to 38220 $mm^2$. In this way, film formation quality of the first passivation film layer 130 at the junction of the first side surface C1 and the second surface S can be fully guaranteed.

Referring to FIG. 4, as another possible implementation, the first passivation film layer 130 covers a surface of the passivated contact layer 150 facing away from the substrate 110, and the part of the first passivation film layer 130 covering the passivated contact layer 150 is located between the second passivation film layer 160 and the passivated contact layer 150.

Further, the solar cell 100 further includes a second electrode 180, and the second electrode 180 is arranged on the second passivation film layer 160, passes through the second passivation film layer 160 and the first passivation film layer 130 from one side of the second surface S, and is in ohmic contact with the passivated contact layer 150.

In this way, the junction of the first side surface C1 and the second surface S can be better protected, and the passivation effect on the second surface S of the substrate 110 can also be enhanced.

In the embodiments of the present disclosure, the first dielectric layer 140 may also cover the first side surface C1.

For example, for the solar cell 100 in the embodiments of FIG. 1 to FIG. 3, coverage ranges of the first dielectric layer 140 and the first passivation film layer 130 may be the same.

FIG. 6 shows a situation where the coverage ranges of the first dielectric layer 140 and the first passivation film layer 130 in the embodiments of FIG. 3 are set to be the same, which is similar to FIG. 1 and FIG. 2 and is not described in detail herein.

It may be understood that Embodiment 1 is described based on an example in which the solar cell 100 is a tunnel oxide passivated contact (TOPCon) solar cell. Certainly, other types of solar cells are also possible.

Embodiment 2

Figures 7, 8, 9:
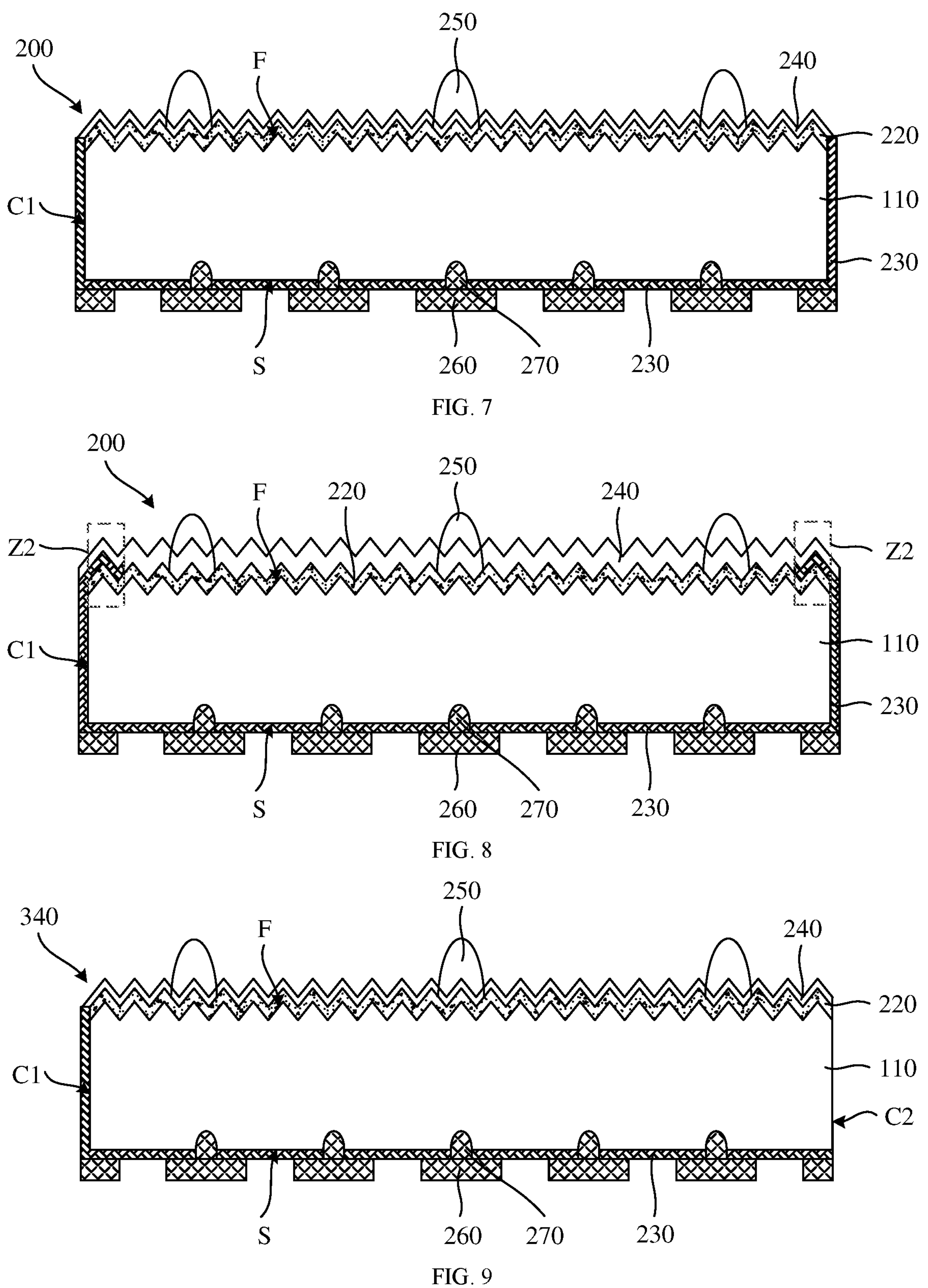
FIG. 7 is a schematic structural diagram of a solar cell according to Embodiment 2 of the present disclosure.
FIG. 8 is another schematic structural diagram of the solar cell according to Embodiment 2 of the present disclosure.
FIG. 9 is a schematic structural diagram of a sliced cell base according to Embodiment 2 of the present disclosure.

FIG. 7 is a schematic structural diagram of a solar cell according to Embodiment 2 of the present disclosure, FIG. 8 is another schematic structural diagram of the solar cell according to Embodiment 2 of the present disclosure, and FIG. 9 is a schematic structural diagram of a sliced cell base according to Embodiment 2 of the present disclosure.

A solar cell 200 provided in Embodiment 2 of the present disclosure includes a substrate 110, a doped conductive layer 220, a third passivation film layer 230, and a second dielectric layer 240. The third passivation film layer 230 is made of a material including at least one of $AlO_x$ and $SiN_x$. For example, the third passivation film layer 230 may be made of $Al_2O_3$, which is featured with a strong H passivation capability, excellent field passivation performance, good film formation quality, and fast film formation time, making it the best choice to improve efficiency of the solar cell.

The second dielectric layer 240 is made of a material including at least one of $SiN_x$ and $SiO_x$, which may be, for example, a laminate structure in which a $SiN_x$ layer and a $SiO_x$ layer are stacked on each other. In this way, passivation and antireflection effects are both better.

In FIG. 7 to FIG. 8, structures, functions, and the like of the substrate 110 and the doped conductive layer 220 are the same as those of the substrate and the doped conductive layer in FIG. 1 to FIG. 6 in Embodiment 1, which are not described in detail herein. In addition, "cover" in Embodiment 2 means the same as that in Embodiment 1, which is not described herein.

Referring to FIG. 7, the doped conductive layer 220 and the second dielectric layer 240 are sequentially stacked on the first surface F of the substrate 110, and both the doped conductive layer 220 and the second dielectric layer 240 cover the first surface F of the substrate 110. The third passivation film layer 230 is stacked on the second surface S of the substrate 110, and the third passivation film layer 230 covers the second surface S of the substrate 110. The third passivation film layer 230 further covers at least part of surfaces of the plurality of first side surfaces C1.

The third passivation film layer 230 further covers at least part of surfaces of the plurality of first side surfaces C1, the plurality of first side surfaces C1 correspond to side surfaces of the solar cell 200, and the third passivation film layer 230 protects at least part of the surfaces of the plurality of first side surfaces C1, which can reduce recombinations on the first side surfaces C1, that is, reduce recombination losses at side edges of the solar cell 200, and improve efficiency of the solar cell 200.

In the embodiments of the present disclosure, the second dielectric layer 240 may be, for example, an antireflection film and may also have an effect of passivation, and both the second dielectric layer 240 and the third passivation film layer 230 may adopt a single-layer or multi-layer structure.

The third passivation film layer 230 further covers at least part of surfaces of the plurality of first side surfaces C1. For example, the third passivation film layer 230 may cover all of the first side surfaces C1, or the third passivation film layer 230 may cover only part of the first side surfaces C1.

In a case where the first side surface C1 is covered with the third passivation film layer 230, the third passivation film layer 230 may cover at least part of the first side surface C1. Certainly, in this case, the third passivation film layer 230 continuously covers the second surface S to the first side surface C1.

Further, the third passivation film layer 230 completely covers each of the first side surfaces C1, so as to better protect the first side surfaces C1 with more evident recombination losses.

As a possible implementation, the third passivation film layer 230 may cover only the second surface S to the first side surface C1 and then stop.

Alternatively, after completely covering the first side surface C1, the first passivation film layer 130 continues to extend towards the first surface F of the substrate 110.

During specific implementation, the third passivation film layer 230 further covers at least an edge of the doped conductive layer 220 on a same side as the first side surface C1.

For example, referring to FIG. 7, the third passivation film layer 230 covers the edge of the doped conductive layer 220 on a same side as the first side surface C1 and stops. Further, the second dielectric layer 240 may be stacked on an edge of the third passivation film layer 230 along the thickness direction of the substrate 110.

Alternatively, referring to FIG. 8, the third passivation film layer 230 further covers an edge region Z2 of the doped conductive layer 220, and the part of the third passivation film layer 230 covering the edge region Z2 is located between the second dielectric layer 240 and the doped conductive layer 220.

It may be understood that the third passivation film layer 230 covers the edge region Z2 of the doped conductive layer 220 and the second dielectric layer 240 is also partially stacked on the part of the third passivation film layer 230 covering the edge region Z2, from which it may be seen that the third passivation film layer 230 is continuously formed from the first side surface C1 to the first surface F of the substrate 110. Compared with a situation where the third passivation film layer 230 is formed only on a side surface of the solar cell 200, film formation at a junction of the first side surface C1 and the first surface F is more reliable and the film formation is more uniform, which can better protect the junction of the first side surface C1 and the first surface F together with the coverage of the second dielectric layer 240. In other words, it can be ensured that the entire first side surface C1 of the substrate 110 and the side surface of the doped conductive layer 220 are wrapped and protected. Certainly, in this case, a passivation field can also be formed in the edge region of the first surface F, and recombination centers of the first surface F of the substrate 110 can also be effectively reduced. Therefore, a junction between a side edge of the solar cell 200 and the first surface F can have a better reduced recombination effect, and the passivation effect on the first surface F can be enhanced.

Further, a coverage area of the third passivation film layer 230 in the edge region Z2 of the doped conductive layer 220 ranges from 1 $mm^2$ to 38220 $mm^2$. In this way, film formation quality of the third passivation film layer 230 at the junction of the first side surface C1 and the first surface F can be fully guaranteed.

Referring to FIG. 9, similar to Embodiment 1, in this embodiment, the solar cell 100 may be cut into sliced cell bases 340. In this case, the substrate 110 further includes at least one cut side surface C2 adjacent between the first surface F and the second surface S. The structure and the function formation process of the cut side surface C2 have been described in detail in Embodiment 1, which are not described in detail herein.

Still referring to FIG. 7, the solar cell 200 in this embodiment further includes a third electrode 250 and a fourth electrode 260. In addition, the second surface S of the substrate 110 is provided with local metal back surface fields 270 arranged at intervals, the third electrode 250 passes through the second dielectric layer 240 and is in ohmic contact with the doped conductive layer 220, and the fourth electrode 260 passes through the third passivation film layer 230 and is in ohmic contact with the local metal back surface field 270.

It may be understood that the solar cell 200 in Embodiment 2 may be, for example, a passivated emitter and rear cell (PERC), which may certainly be other types of solar cells.

Embodiment 3

Current solar cells require laser cutting to form sliced cells before being manufactured into modules. Exposed cut side surfaces formed in the sliced cells may reduce efficiency and reliability of photovoltaic modules. To this end, this embodiment further provides a sliced cell, which can reduce an influence of cutting on efficiency of the photovoltaic module by edge passivation on the cut side surface.

Figure 10:
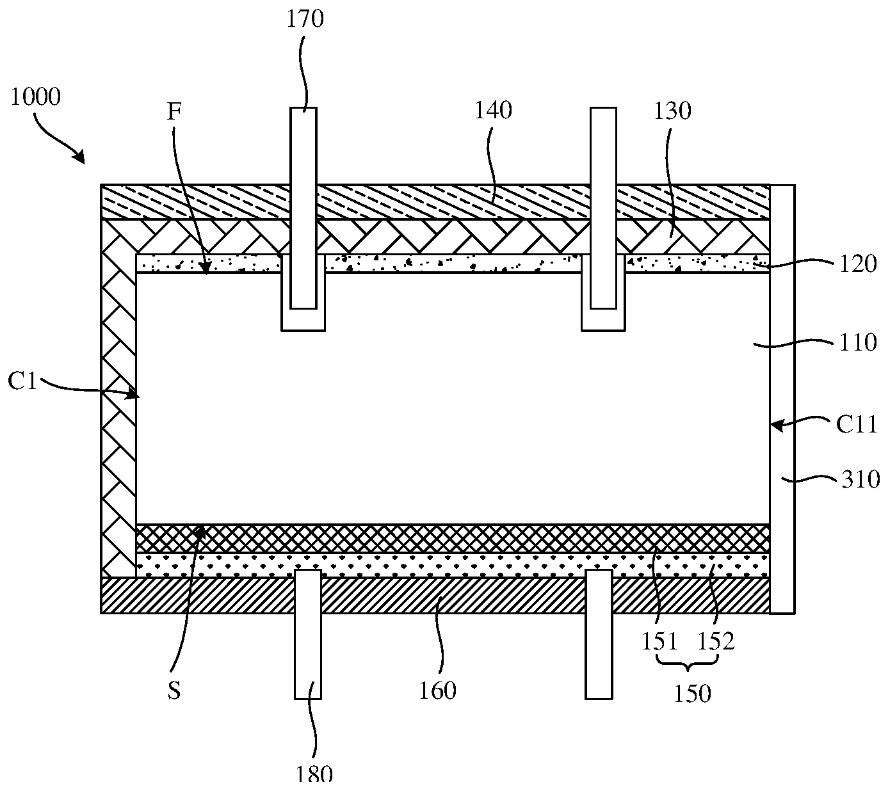
FIG. 10 is a schematic structural diagram of a sliced cell according to Embodiment 3 of the present disclosure.
Figure 11:
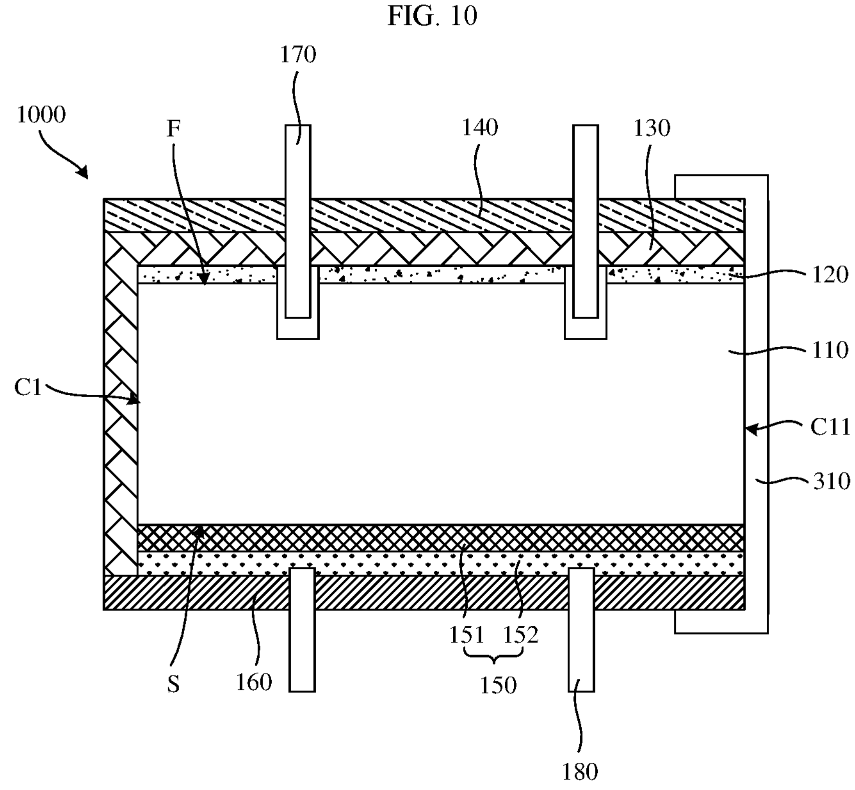
FIG. 11 is another schematic structural diagram of the sliced cell according to Embodiment 3 of the present disclosure.

FIG. 10 is a schematic structural diagram of a sliced cell according to Embodiment 3 of the present disclosure, and FIG. 11 is another schematic structural diagram of the sliced cell according to Embodiment 3 of the present disclosure.

Referring to FIG. 10 and FIG. 11, specifically, this embodiment provides a sliced cell, including a first body 1000 and a fourth passivation film layer 310.

The first body 1000 is cut from the solar cell 100 in Embodiment 1, and the substrate 110 in the first body 1000 further includes at least one first cut side surface C11 adjacent to the first surface F. The fourth passivation film layer 310 is arranged on the first cut side surface C11 in a one-to-one correspondence manner, that is, each first cut side surface C11 is covered with the fourth passivation film layer 310, and the fourth passivation film layer 310 completely covers the corresponding first cut side surface C11. In this way, the first cut side surface C11 can be well protected to prevent recombination leakage and the like.

Further, the fourth passivation film layer 310 further covers at least part of a surface of the first body 1000 on one side of the first surface F. In this way, a junction between one side of the first surface F and the first cut side surface C11 of the first body 1000 can also be better passivated.

Alternatively, in a case where the substrate 110 further includes a second surface S, the fourth passivation film layer 310 further covers at least part of a surface of the first body 1000 on one side of the second surface S. In this way, a junction between one side of the second surface S and the first cut side surface C11 of the first body 1000 can also be better passivated.

Alternatively, referring to FIG. 11, the fourth passivation film layer 310 further covers at least part of a surface of the first body 1000 on one side of the first surface F. Moreover, the fourth passivation film layer 310 further covers at least part of a surface of the first body 1000 on one side of the second surface S. In this way, junctions between one side of the first surface F and the first cut side surface C11 and between one side of the second surface S and the first cut side surface C11 of the first body 1000 can both be better passivated.

Certainly, when the fourth passivation film layer 310 further covers at least part of the surface of the first body 1000 on one side of the first surface F, the fourth passivation film layer 310 covers only an edge region of the first dielectric layer 140.

Alternatively, the first dielectric layer 140 is provided with a first electrode 170, the first electrode 170 includes a first busbar, the fourth passivation film layer 310 covers a first region of the first dielectric layer 140, and the first region is a region on a surface of the first dielectric layer 140 facing away from the substrate 110 where the first busbar is not provided, so as to expose the first busbar to facilitate electrical connections between respective sliced cells and solder strips. It is to be noted that the first region herein is a region on the surface of the first dielectric layer 140 facing away from the substrate 110 except for the region where the first busbar is provided.

Moreover, when the fourth passivation film layer 310 further covers at least part of the surface of the first body 1000 on one side of the second surface S, the fourth passivation film layer 310 covers an edge region of the second passivation film layer 160; or the second passivation film layer 160 is provided with a second electrode 180, the second electrode 180 includes a second busbar, the fourth passivation film layer 310 covers a second region of the second passivation film layer 160, and the second region is a region on a surface of the second passivation film layer 160 facing away from the substrate 110 where the second busbar is not provided, so as to expose the second busbar to facilitate electrical connections between respective sliced cells and solder strips. It is to be noted that the second region herein is a region on the surface of the second passivation film layer 160 facing away from the substrate 110 except for the region where the second busbar is provided.

It may be understood that in FIG. 10 and FIG. 11, the description is based on an example in which one side of the first surface F and one side of the second surface S are each provided with the fourth passivation film layer 310 and the fourth passivation film layers 310 both cover only the edge regions of the first dielectric layer 140 and the second passivation film layer 160. In actual arrangement, in a case where the first cut side surface C11 is covered with the fourth passivation film layer 310, a situation where the fourth passivation film layer 310 further extends to one side of the first surface F and one side of the second surface S may further include the following possible implementations.

The fourth passivation film layer 310 covers only the edge region of the first dielectric layer 140, and the fourth passivation film layer 310 does not cover the second passivation film layer 160.

The fourth passivation film layer 310 covers a first region of the first dielectric layer 140, and the fourth passivation film layer 310 does not cover the second passivation film layer 160.

The fourth passivation film layer 310 does not cover the first dielectric layer 140, and the fourth passivation film layer 310 covers only the edge region of the second passivation film layer 160.

The fourth passivation film layer 310 does not cover the first dielectric layer 140, and the fourth passivation film layer 310 covers the second region of the second passivation film layer 160.

Certainly, a coverage area of the fourth passivation film layer 310 may alternatively be a combination of the above situations, which is not described in detail herein.

Further, the fourth passivation film layer 310 may be an $Al_2O_3$ film layer, and the $Al_2O_3$ film layer is featured with a strong H passivation capability, excellent field passivation performance, good film formation quality, and fast film formation time, making it the best choice to improve efficiency of the sliced cell.

Embodiment 4

FIG. 12 is a schematic structural diagram of a sliced cell according to Embodiment 4 of the present disclosure, and FIG. 13 is another schematic structural diagram of the sliced cell according to Embodiment 4 of the present disclosure.

Referring to FIG. 12 and FIG. 13, the sliced cell provided in this embodiment includes a second body 2000 and a fifth passivation film layer 320.

The second body 2000 is cut from the solar cell 200 in Embodiment 2, and the substrate 110 in the second body 2000 further includes at least one second cut side surface C12 adjacent between the first surface F and the second surface S. The fifth passivation film layer 320 is arranged on the second cut side surface C12 in a one-to-one correspondence manner, and the fifth passivation film layer 320 completely covers the corresponding second cut side surface C12. In this way, the second cut side surface C12 can be well protected to prevent recombination leakage and the like.

Further, the fifth passivation film layer 320 further covers at least part of a surface of the second body 2000 on one side of the first surface F. In this way, a junction between one side of the first surface F and the second cut side surface C12 of the second body 2000 can also be better passivated.

Alternatively, the fifth passivation film layer 320 further covers at least part of a surface of the second body 2000 on one side of the second surface S. In this way, a junction between one side of the second surface S and the second cut side surface C12 of the second body 2000 can also be better passivated.

Alternatively, referring to FIG. 13, the fifth passivation film layer 320 further covers at least part of a surface of the second body 2000 on one side of the first surface F, and the fifth passivation film layer 320 further covers at least part of a surface of the second body 2000 on one side of the second surface S. In this way, junctions between one side of the first surface F and the second cut side surface C12 and between one side of the second surface S and the second cut side surface C12 of the second body 2000 can both be better passivated.

Certainly, when the fifth passivation film layer 320 further covers at least part of the surface of the second body 2000 on one side of the first surface F, the fifth passivation film layer 320 covers an edge region of the second dielectric layer 240.

Alternatively, the second dielectric layer 240 is provided with a third electrode 250, the third electrode 250 includes a third busbar, the fifth passivation film layer 320 covers a third region of the second dielectric layer 240, and the third region is a region on a surface of the second dielectric layer 240 facing away from the substrate 110 where the third busbar is not provided, so as to expose the third busbar to facilitate electrical connections between respective sliced cells and solder strips. It is to be noted that the third region herein is a region on the surface of the second dielectric layer 240 facing away from the substrate 110 except for the region where the third busbar is provided.

Moreover, when the fifth passivation film layer 320 further covers at least part of the surface of the second body 2000 on one side of the second surface S, the fifth passivation film layer 320 covers an edge region of the third passivation film layer 230; or the third passivation film layer 230 is provided with a fourth electrode 260, the fourth electrode 260 includes a fourth busbar, the fifth passivation film layer 320 covers a fourth region of the third passivation film layer 230, and the fourth region is a region on a surface of the third passivation film layer 230 facing away from the substrate 110 where the fourth busbar is not provided, so as to expose the fourth busbar to facilitate electrical connections between respective sliced cells and solder strips. It is to be noted that the fourth region herein is a region on the surface of the third passivation film layer 230 facing away from the substrate 110 except for the region where the fourth busbar is provided.

It may be understood that in FIG. 12 and FIG. 13, the description is based on an example in which one side of the first surface F and one side of the second surface S are each provided with the fifth passivation film layer 320 and the fifth passivation film layers 320 both cover only the edge regions of the second dielectric layer 240 and the third passivation film layer 230. In actual arrangement, in a case where the second cut side surface C12 is covered with the fifth passivation film layer 320, a situation where the fifth passivation film layer 320 further extends to one side of the first surface F and one side of the second surface S may further include the following possible implementations.

The fifth passivation film layer 320 covers only the edge region of the second dielectric layer 240, and the fifth passivation film layer 320 does not cover the third passivation film layer 230.

The fifth passivation film layer 320 covers the third region of the second dielectric layer 240, and the fifth passivation film layer 320 does not cover the third passivation film layer 230.

The fifth passivation film layer 320 does not cover the second dielectric layer 240, and the fifth passivation film layer 320 covers only the edge region of the third passivation film layer 230.

The fifth passivation film layer 320 does not cover the second dielectric layer 240, and the fifth passivation film layer 320 covers a fourth region of the third passivation film layer 230.

Certainly, a coverage area of the fifth passivation film layer 320 may alternatively be a combination of the above situations, which is not described in detail herein.

Further, the fifth passivation film layer may be an $Al_2O_3$ film layer, and the $Al_2O_3$ film layer is featured with a strong H passivation capability, excellent field passivation performance, good film formation quality, and fast film formation time, making it the best choice to improve efficiency of the sliced cell.

Embodiment 5

Figure 14:
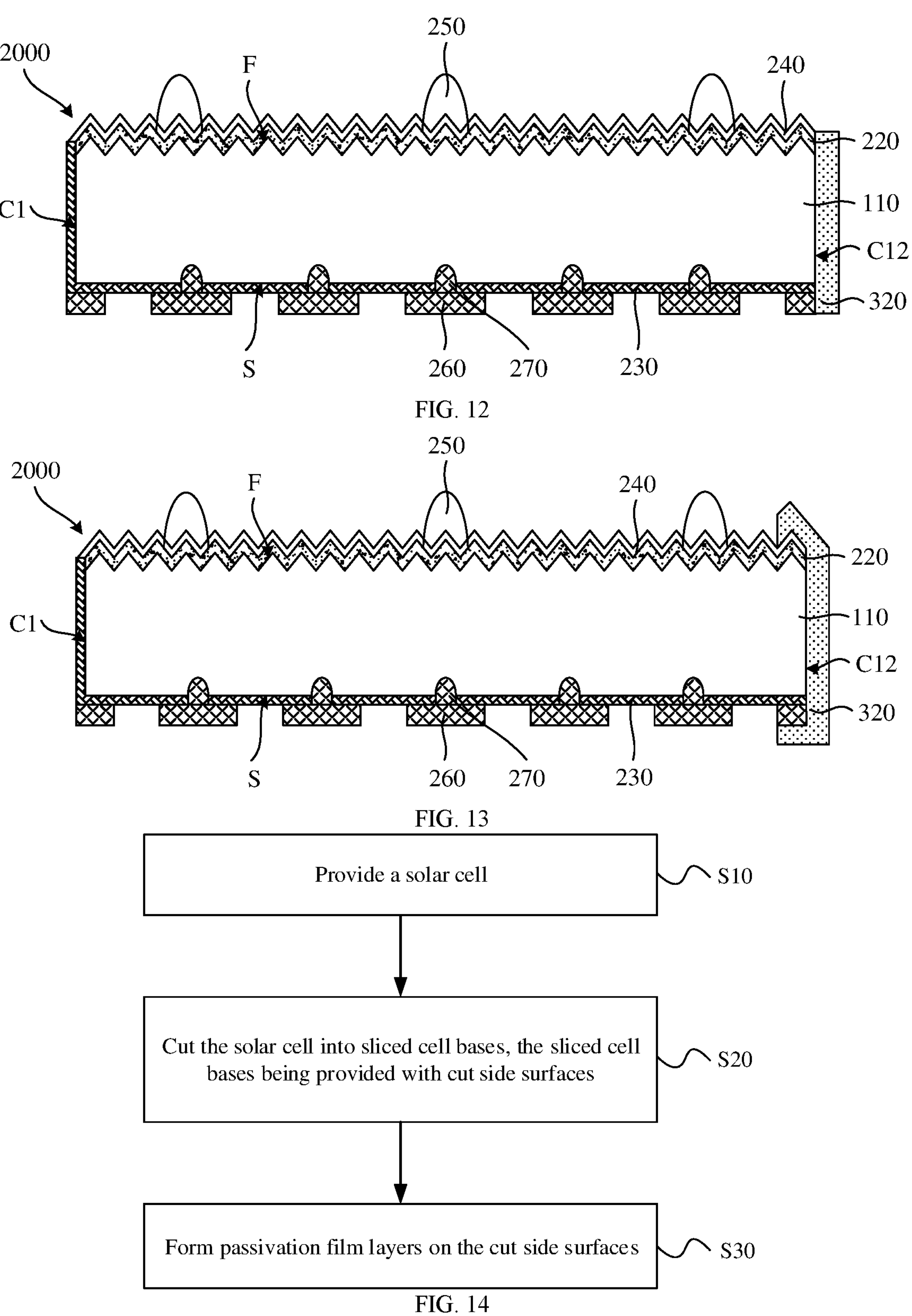
FIG. 14 is a schematic flowchart of a manufacturing method for a sliced cell according to Embodiment 5 of the present disclosure.
Figures 15, 16:
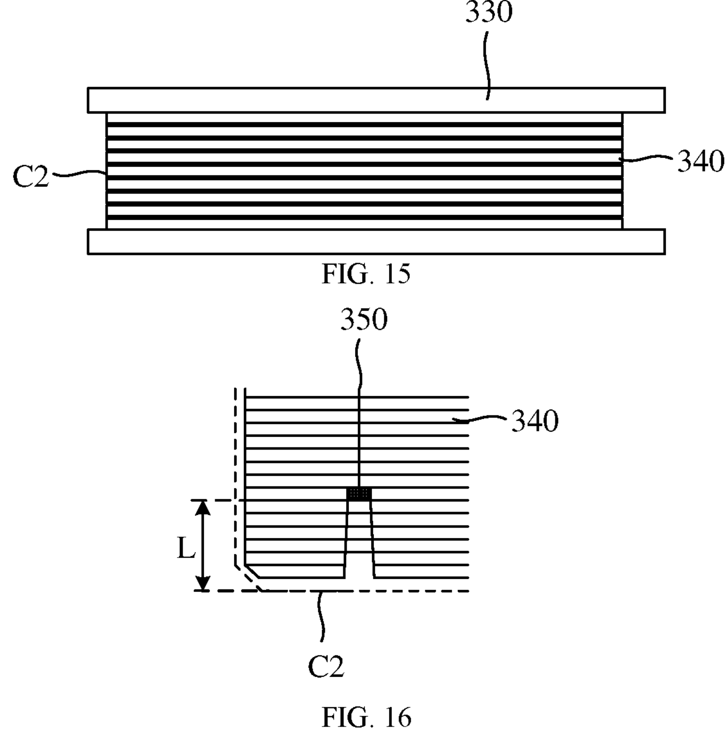
FIG. 15 is a schematic structural diagram of sliced cells in the manufacturing method for a sliced cell according to Embodiment 5 of the present disclosure.
FIG. 16 is a schematic structural diagram of one side of a first surface or one side of a second surface of a sliced cell base.

FIG. 14 is a schematic flowchart of a manufacturing method for a sliced cell according to Embodiment 5 of the present disclosure, FIG. 15 is a schematic structural diagram of sliced cells in the manufacturing method for a sliced cell according to Embodiment 5 of the present disclosure, and FIG. 16 is a schematic structural diagram of one side of a first surface or one side of a second surface of a sliced cell base.

Referring to FIG. 14, FIG. 5, and FIG. 9, this embodiment provides a manufacturing method for a sliced cell. The method includes the following steps.

In S10, a solar cell is provided. The solar cell is the solar cell in Embodiment 1 or Embodiment 2.

In S20, the solar cell is cut into sliced cell bases 340, and the sliced cell bases 340 are provided with cut side surfaces C2.

In S30, the passivation film layers are formed on the cut side surfaces C2.

It is to be noted that in a case where the solar cell is the solar cell 100 in Embodiment 1, the sliced cell base 340 is the first body 1000, the cut side surface C2 is the first cut side surface C11, and the passivation film layer is the fourth passivation film layer 310. In a case where the solar cell is the solar cell 200 in Embodiment 2, the sliced cell base 340 is the second body 2000, the cut side surface C2 is the second cut side surface C12, and the passivation film layer is the fifth passivation film layer 320.

Further, referring to FIG. 5, the cut side surfaces C2 included in the sliced cell bases 340 are same in number and position. In this way, step S30 of forming passivation film layers on the cut side surfaces C2 specifically includes:

stacking the sliced cell bases 340 along a thickness direction in a state where the cut side surfaces C2 corresponding to the sliced cell bases 340 are aligned; and forming the passivation film layers on the cut side surfaces C2.

In this way, a passivation film layer with good quality can be formed on each cut side surface C2.

Certainly, subsequent to the step of stacking the sliced cell bases 340 along a thickness direction in a state where the cut side surfaces C2 corresponding to the sliced cell bases 340 are aligned, the method further includes:

arranging baffles 330 on outer side surfaces of two outermost sliced cell bases 340 in a stacking direction in the stacked sliced cell bases 340. In this way, since both front and back surfaces of the stacked sliced cell bases 340 are covered, the passivation film layer basically covers only the cut side surface C2 and regions of 1 to 3 mm on front and back surfaces of the laminate. Referring to FIG. 16, whereas a spacing L of a busbar 350 from the cut side surface C2 is to be 5 mm (e.g., 7 mm) or more, the passivation film layer may not substantially touch the busbar 350.

It is to be noted that the passivation film layer may be an $Al_2O_3$ film layer. The passivation film layer is manufactured by, but not limited to, atomic layer deposition, plasma enhanced chemical vapor deposition, or sputtering deposition. A thickness of the passivation film layer may range from 1 nm to 50 nm.

The manufacturing method for a sliced cell in this embodiment is described below with a specific example. The method includes the following steps.

In step one, the solar cell 100 is laser cut to form sliced cell bases 340 that includes cut side surfaces C2. Herein, for example, the solar cell 100 is halved to form half cells as the sliced cell bases 340.

In step two, the half cells are stacked, mutually corresponding cut side surfaces C2 are kept on a same interface (plane), baffles 330 are arranged on the half cells located on furthest sides in the thickness direction, the half cells that are provided with the baffles 330 and stacked are placed in an atomic layer deposition process chamber, so as to ensure that only the side surfaces are in contact with an atomic layer deposition source and to basically ensure that all cut side surfaces C2 can be passivated by $Al_2O_3$.

It is to be noted that front and back surfaces of the $Al_2O_3$ film layer formed through the above steps are both covered by the baffles 330, the passivation film layer covers only the cut side surfaces C2 and regions of 1 to 3 mm on the front and back surfaces, which may not affect the busbar 350 on the half cell.

The sliced cells formed with the above method do not lose efficiency, and a module production ratio of the photovoltaic module can be increased by more than 1%.

Embodiment 6

Embodiments of the present disclosure further provide a photovoltaic module and a photovoltaic system (not shown).

The photovoltaic module includes at least one solar cell string. The solar cell string includes at least two solar cells as described in Embodiment 1 and/or Embodiment 2. The solar cells may be connected together by series soldering.

Alternatively, the solar cell strings may include at least two sliced cells in Embodiment 3 and/or Embodiment 4.

The photovoltaic system includes the photovoltaic module described above. The photovoltaic system may be applied to photovoltaic power stations, such as ground power stations, rooftop power stations, and water surface power stations, or applied to devices or apparatuses that use solar energy to generate electricity, such as user solar power supplies, solar street lights, solar cars, and solar buildings. Certainly, it may be understood that application scenarios of the photovoltaic system are not limited thereto. In other words, the photovoltaic system may be applied to all fields required to use solar energy to generate electricity. Taking a photovoltaic power generation network as an example, the photovoltaic system may include a photovoltaic array, a combiner box, and an inverter. The photovoltaic array may be an array of a plurality of photovoltaic modules. For example, the plurality of photovoltaic modules may form a plurality of photovoltaic arrays. The photovoltaic arrays are connected to the combiner box, and the combiner box may combine currents generated by the photovoltaic arrays. The combined current flows through the inverter and is converted into an alternating current suitable for a power grid, and then connected to the power grid to realize solar power supply.

The technical features of the above-mentioned embodiments can be combined arbitrarily. In order to make the description concise, not all possible combinations of the technical features are described in the embodiments. However, as long as there is no contradiction in the combination of these technical features, the combinations should be considered as in the scope of the specification.

The above embodiments are only several implementations of the present disclosure, and the descriptions are relatively specific and detailed, but they should not be construed as limiting the scope of the present disclosure. It should be understood by those of ordinary skill in the art that various modifications and improvements can be made without departing from the concept of the present disclosure, and all fall within the protection scope of the present disclosure. Therefore, the patent protection of the present disclosure shall be defined by the appended claims.

The invention claimed is:

1. A solar cell, comprising:

a substrate, a doped conductive layer, a first passivation film layer, a first dielectric layer, a passivated contact layer, a second passivation film layer, and a second electrode;

wherein the doped conductive layer is arranged on a first surface of the substrate;

wherein the first passivation film layer and the first dielectric layer are sequentially stacked on a side of the doped conductive layer facing away from the substrate;

wherein the doped conductive layer, the first passivation film layer, and the first dielectric layer all cover the first surface of the substrate;

wherein the substrate further includes a plurality of first side surfaces adjacent to the first surface, and the first passivation film layer further covers at least part of surfaces of the plurality of first side surfaces;

wherein the substrate further includes a second surface adjacent to the plurality of first side surfaces and opposite to the first surface, the passivated contact layer is arranged on the second surface of the substrate, the passivated contact layer includes a tunnel oxide layer and a polysilicon doped conductive layer sequentially stacked on the second surface of the substrate;

wherein the second passivation film layer is stacked on a surface of the passivated contact layer facing away from the substrate, and the passivated contact layer and the second passivation film layer both cover the second surface of the substrate;

wherein a part of the first passivation film layer further covers the second surface of the substrate, and covers an edge region of the passivated contact layer located on the second surface of the substrate, and the part of the first passivation film layer covering the edge region is located between the second passivation film layer and the passivated contact layer on the second surface;

wherein the second electrode is arranged on the second passivation film layer, passing through the second passivation film layer, and being in ohmic contact with the passivated contact layer;

wherein the first passivation film layer is spaced from the second electrode by the second passivation film layer on the second surface; and wherein the first passivation film layer and the second passivation film layer being made of different materials.

2. The solar cell according to claim 1, wherein the first passivation film layer completely covers each of the first side surfaces.

3. The solar cell according to claim 2, wherein the first passivation film layer further covers at least an edge of the passivated contact layer on a same side as the first side surface.

4. The solar cell according to claim 1, wherein a coverage area of the first passivation film layer in the edge region of the passivated contact layer ranges from 1 $mm^2$ to 38220 $mm^2$.

5. The solar cell according to claim 1, wherein the second passivation film layer is made of a material composed of at least one of $SiN_x$, $SiON_x$, and $SiO_x$.

6. The solar cell according to claim 1, further comprising a third dielectric layer, the third dielectric layer being located between the doped conductive layer and the first passivation film layer.

7. The solar cell according to claim 6, wherein the third dielectric layer is a thermal oxidation layer.

8. The solar cell according to claim 1, wherein the first passivation film layer is made of a material composed of $AlO_x$; and/or the first dielectric layer is an antireflection layer, and the first dielectric layer is made of a material composed of at least one of $SiN_x$, $SiON_x$, and $SiO_x$.

9. A sliced cell, comprising:

a first body, the first body being cut from the solar cell according to claim 1, the substrate in the first body further comprising at least one first cut side surface adjacent to the first surface; and a fourth passivation film layer arranged on the first cut side surface in a one-to-one correspondence manner, and the fourth passivation film layer completely covering the corresponding first cut side surface.

10. The sliced cell according to claim 9, wherein the fourth passivation film layer further covers at least part of a surface of the first body on one side of the first surface; and/or the substrate further includes a second surface opposite to the first surface, and the fourth passivation film layer further covers at least part of a surface of the first body on one side of the second surface.

11. The sliced cell according to claim 10, wherein when the fourth passivation film layer further covers at least part of the surface of the first body on one side of the first surface, the fourth passivation film layer covers an edge region of the first dielectric layer; or the first dielectric layer is provided with a first electrode, the first electrode includes a first busbar, and the fourth passivation film layer covers a first region of the first dielectric layer, the first region being a region on a surface of the first dielectric layer facing away from the substrate where the first busbar is not provided.

12. The sliced cell according to claim 10, wherein the solar cell further comprises a passivated contact layer arranged on one side of a second surface of the substrate, and a second passivation film layer stacked on a surface of a side of the passivated contact layer facing away from the substrate; wherein the second surface of the substrate is adjacent to the first side surface and is opposite to the first surface;

the passivated contact layer and the second passivation film layer both cover the second surface of the substrate; and when the fourth passivation film layer further covers at least part of the surface of the first body on one side of the second surface, the fourth passivation film layer covers an edge region of the second passivation film layer; or the second passivation film layer is provided with a second electrode, the second electrode includes a second busbar, and the fourth passivation film layer covers a second region of the second passivation film layer, the second region being a region on a surface of the second passivation film layer facing away from the substrate where the second busbar is not provided.

13. A photovoltaic module, comprising at least one solar cell string, the solar cell string including at least two solar cells according to claim 1.

14. A photovoltaic system, comprising the photovoltaic module according to claim 13.

15. The solar cell according to claim 1, wherein the second electrode is in ohmic contact with the polysilicon doped conductive layer and spaced apart from the substrate by the tunnel oxide layer.

16. A solar cell, comprising:

a substrate, a doped conductive layer, a first passivation film layer, a first dielectric layer, a passivated contact layer, a second passivation film layer, and a second electrode;

wherein the doped conductive layer is arranged on a first surface of the substrate;

wherein the first passivation film layer and the first dielectric layer are sequentially stacked on a side of the doped conductive layer facing away from the substrate;

wherein the doped conductive layer, the first passivation film layer, and the first dielectric layer all cover the first surface of the substrate;

wherein the substrate further includes a plurality of first side surfaces adjacent to the first surface, and the first passivation film layer further covers at least part of surfaces of the plurality of first side surfaces;

wherein the substrate further includes a second surface adjacent to the plurality of first side surfaces and opposite to the first surface, the passivated contact layer is arranged on the second surface of the substrate, the passivated contact layer includes a tunnel oxide layer and a polysilicon doped conductive layer sequentially stacked on the second surface of the substrate;

wherein the second passivation film layer is stacked on a surface of the passivated contact layer facing away from the substrate, and the passivated contact layer and the second passivation film layer both cover the second surface of the substrate;

wherein a part of the first passivation film layer further covers the second surface of the substrate, and covers an edge region of the passivated contact layer located on the second surface of the substrate, and the part of the first passivation film layer covering the edge region is located between the second passivation film layer and the passivated contact layer on the second surface;

wherein the second electrode is arranged on the second passivation film layer, sequentially passing through the second passivation film layer and the first passivation film layer, and being in ohmic contact with the passivated contact layer; and wherein the first passivation film layer and the second passivation film layer being made of different materials.

* * * * *